United States Patent [19]
Hadley

[11] 4,016,498
[45] Apr. 5, 1977

[54] VARIABLE DUTY CYCLE WAVEFORM GENERATOR

[75] Inventor: LeMoyne F. Hadley, Loveland, Colo.

[73] Assignee: Hewlett-Packard Company, Palo Alto, Calif.

[22] Filed: Sept. 25, 1975

[21] Appl. No.: 616,725

[52] U.S. Cl. .............................. 328/181; 307/228; 307/265; 328/185
[51] Int. Cl.² ..................... H03K 4/10; H03K 5/04
[58] Field of Search ................ 307/228, 229, 265; 328/181–185, 58

[56] References Cited
UNITED STATES PATENTS

| 2,602,151 | 7/1952 | Carbrey | 328/183 |
| 2,726,331 | 12/1955 | Robinson | 328/181 |
| 3,676,698 | 7/1972 | Hunter | 307/228 |
| 3,859,603 | 1/1975 | Herzner | 328/181 |
| 3,943,456 | 3/1976 | Luce | 328/185 |

Primary Examiner—Stanley D. Miller, Jr.
Attorney, Agent, or Firm—David A. Boone

[57] ABSTRACT

A triangular waveform is generated by alternately charging and discharging a capacitor through two voltage-controlled current sources. A single tuning amplifier and a variable impedance, coupled to the voltage-controlled current sources, allow the symmetry of the triangular waveform to be varied while a constant repetition rate is maintained.

1 Claim, 2 Drawing Figures

VARIABLE DUTY CYCLE WAVEFORM GENERATOR

BACKGROUND & SUMMARY OF THE INVENTION

Waveform generators are used in function generators to control the generation of various output signals such as pulses, and ramps. The duration of these signals may be controlled by varying the duty cycle of a triangular waveform output by the waveform generator. Typically, the symmetry of the triangular waveform was varied to provide different signal durations. However, past techniques have the disadvantage that the frequency of the triangular waveform generated was affected when the symmetry was altered. This is because each leg of the triangular waveform was independently adjusted.

In the preferred embodiment of the present invention independent adjustment of the symmetry and frequency of the triangular waveform is provided. A signal produced by a tuning amplifier determines the frequency of the triangular waveform. A symmetry control circuit divides this signal into two control signals. Two voltage controlled current sources, responsive to the control signals are switched to alternately charge and discharge a capacitor to produce the triangular waveform.

DESCRPTION OF THE DRAWINGS

DESCRIPTION OF THE PREFERRED EMBODIMENT

Figure 1:
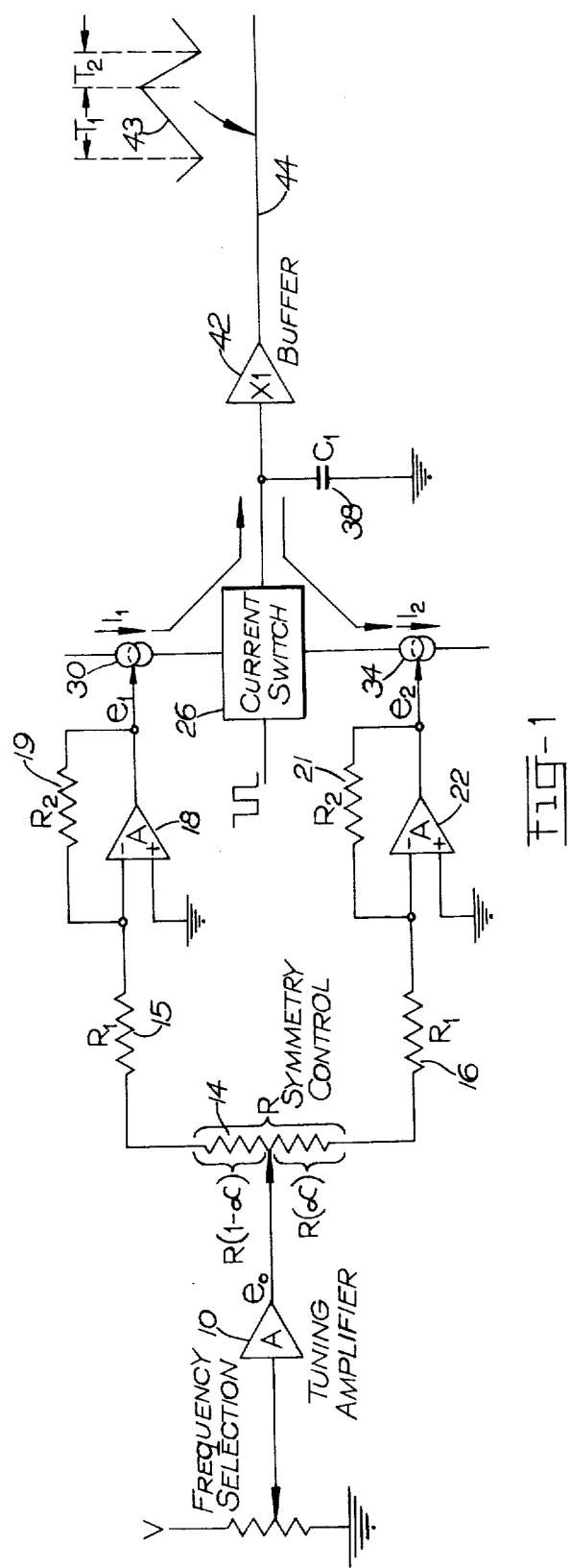
FIG. 1 is a block diagram of the preferred embodiment.

Referring to FIG. 1, a tuning amplifier 10 provides a signal $e_o$ which represents the desired frequency of a triangular waveform 43 to be output from buffer 42. The signal from tuning amplifier 10 is coupled to an amplifier 18 and an amplifier 22 through variable impedance 14. The triangular waveform signal 43 on a line 44 is produced by the alternate charging and discharging of a capacitor 38 by a current source 30 and a current source 34.

Referring to the diagram of waveform 43 in FIG. 1, the period $T_1$ of the positive slope of the triangle is proportional to $1/I_1$ while $T_2$, the period of the negative slope, is proportional to $1/I_2$. $I_1$ and $I_2$ are in turn linear functions of signals $e_1$ and $e_2$ thus:

$$k/T_1 = e_1 \text{ and } k/T_2 = e_2 \quad (1)$$

where $k$ is a constant determined by the frequency range conrols.

To maintain constant frequency $f_o$.

$$T_1 + T_2 = 1/f_o \quad (2)$$

From (1) and (2), we have:

$$(1/e_1) + (1/e_2) = (1/kf_o) \quad (3)$$

Therefore, to maintain a constant frequency while the symmetry is varied, $e_1$ and $e_2$ must be varied in such a way as to keep the left side of equation (3) constant. Since the relationship between $e_1$ and $e_2$ is not linear, this requirement has caused past efforts to provide independent adjustment of each leg of the triangular waveform. This resulted in the aforementioned problem of frequency change when the symmetry of the waveform was altered.

The solution used in the preferred embodiment is illustrated by the following equations:

$$e_1 = e_o \left[ \frac{R_2}{R_1 + R(1-\alpha)} \right] \quad (4)$$

$$e_2 = e_o \left( \frac{R_2}{R_1 + R\alpha} \right) \quad (5)$$

Where $\alpha$ is the fractional rotation of the symmetry control, and ranges from 0 to 1.

Substituting (4) and (5) into (3), we have:

$$\frac{R_1 + R(1-\alpha)}{e_o R_2} + \frac{R_1 + R\alpha}{e_o R_2} = \frac{1}{kf_o}$$

Combining terms yields:

$$\frac{R_1 + R}{e_o R_2} = \frac{1}{kf_o}$$

Thus, the frequency $f_o$ is completely independent of $\alpha$, the symmetry control setting.

$e_1$ and $e_2$ may vary over the range:

$$e_o \left( \frac{R_2}{R_1 + R} \right) \leq e_1 \text{ (or } e_2) \leq e_o \frac{R_2}{R_1} \quad (6)$$

The relationships selected to satisfy equation (6) determine the duty cycle range which is selectable while maintaining a constant freqency for signal 43. Note that resistors 15 and 16 are present only to ensure a minimum resistance, $R_1$, couples the signal $e_o$ to the inverting inputs of amplifiers 18 and 22. Resistors 19 and 21 are used to determine the gain of amplifiers 18 and 22.

Figure 2:
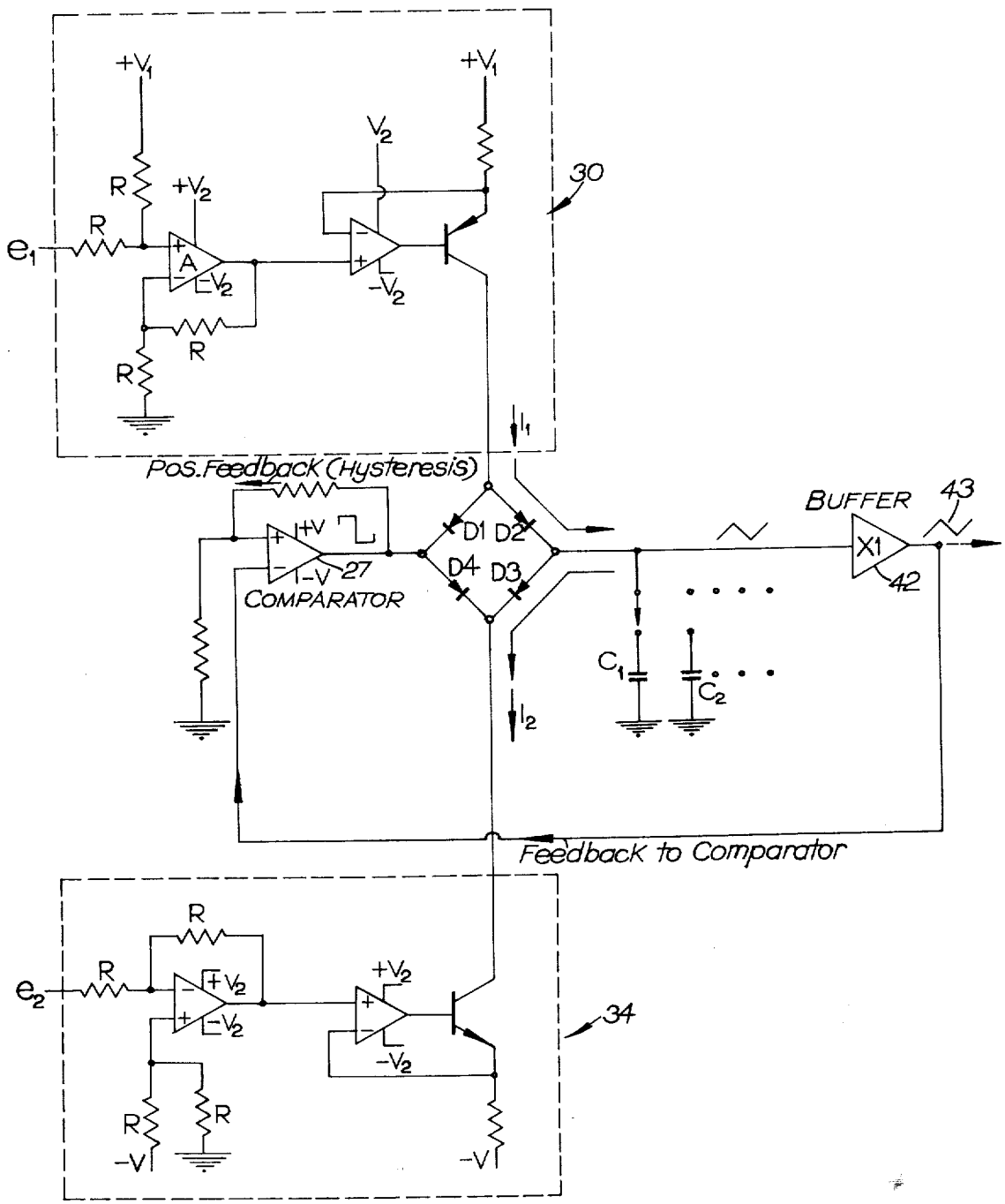
FIG. 2 is a schematic diagram of the circuitry used in the preferred embodiment.

Referring now to the schematic diagram of FIG. 2, the operation of the current switch circuitry utilizes a diode bridge having diodes D1, D2, D3, and D4. The inverting input of comparator 27 receives the signal output by amplifier 42. When the output of amplifier 42 is low, the output of comparator 27 is a positive voltage and this back biases diode D1. $I_1$ from current source 30 then flows through diode D2 and charges capacitor C1 to produce the positive slope of signal 43. Current $I_2$ is supplied by the comparator 27 output through diode D4 during this portion of the cycle. When signal 43 reaches its upper limit, comparator 27 will output a low signal. $I_1$ will then flow through diode D1 and comparator circuit 27 to the negative power supply. C1 will then discharge through diode D3. The above described sequence of events is repeated for each triangular shaped waveform of signal 43.

For a different frequency range, capacitor C1 may be replaced by a capacitor of a different value. Also, the current sources may be modified to provide different currents for $I_1$ and $I_2$. In these ways, a number of different frequency ranges may be covered by the same circuit.

I claim:

1. A waveform generator circuit comprising:
   means for energy storage;
   switching means coupled to the means for energy storage for alternately switching a first and a second electrical current to the means for energy storage;
   tuning means for producing a first electrical signal, said first electrical signal representing a selected frequency;
   dividing means coupled to the tuning means for dividing said first electrical signal into a first component and a second component; and
   means coupled to the dividing means for providing the first and second electrical currents in response to said first and second components of said first electrical signal, and for maintaining a constant value for the sum of the reciprocal values of said first and second control signals irrespective of the relative value of said first and second components of said first electrical signal, the sum of the reciprocal values of said first and second control signals being dependent on said first electrical signal;
   said means for providing the first and second control signals comprising:
   a first amplifier having inverting and non-inverting inputs and a feedback path through a first feedback impedance to the inverting input, for receiving the first component of said first electrical signal at the inverting input, said non-inverting input being tied to a first reference voltage, said first amplifier providing a first DC control voltage in response to the first component of the first electrical signal;
   a first DC controlled current source coupled to said amplifier and said switching means for providing the first electrical current in response to the first DC control voltage;
   a second amplifier, having inverting and non-inverting inputs and a feedback path from the output through a second feedback impedance to the inverting input, said non-inverting input being tied to a second reference voltage said second amplifier providing a second DC control voltage in response to the second component of said first electrical signal; and
   a second voltage controlled current source coupled to said second amplifier and said switching means for providing the second electrical current in response to said second DC control voltage.

* * * * *